(12) United States Patent
Nagaseki et al.

(10) Patent No.: US 6,365,060 B1
(45) Date of Patent: Apr. 2, 2002

(54) METHOD FOR CONTROLLING PLASMA PROCESSOR

(75) Inventors: Kazuya Nagaseki, Yamanashi (JP); Hiroki Yamazaki, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/485,935
(22) PCT Filed: Aug. 11, 1998
(86) PCT No.: PCT/JP98/03571
§ 371 Date: Feb. 18, 2000
§ 102(e) Date: Feb. 18, 2000
(87) PCT Pub. No.: WO99/11103
PCT Pub. Date: Mar. 4, 1999

(30) Foreign Application Priority Data

Aug. 22, 1997 (JP) .............................. 9-241821

(51) Int. Cl.⁷ ..................... H05H 1/46; H01L 21/3065
(52) U.S. Cl. .................. 216/59; 216/67; 427/8; 438/714
(58) Field of Search ............... 216/59, 67; 204/192.13, 204/192.33; 427/8; 438/714

(56) References Cited

U.S. PATENT DOCUMENTS

| | | | |
|---|---|---|---|
| 4,985,114 A | * | 1/1991 | Okudaira et al. ............ 156/643 |
| 5,716,534 A | | 2/1998 | Tsuchiya et al. .............. 216/67 |
| 5,723,386 A | * | 3/1998 | Ishikawa .................... 438/787 |
| 5,983,828 A | * | 11/1999 | Savas .......................... 216/68 |
| 6,190,512 B1 | * | 2/2001 | Lantsman .............. 204/192.12 |

FOREIGN PATENT DOCUMENTS

| | | |
|---|---|---|
| JP | 57-131374 | 8/1982 |
| JP | 63-257200 | 10/1988 |
| JP | 1-106432 | 4/1989 |
| JP | 8-115901 | 5/1996 |
| JP | 9-502482 | 3/1997 |
| JP | 9-186141 | 7/1997 |

* cited by examiner

Primary Examiner—Anita Alanko
(74) Attorney, Agent, or Firm—Finnegan Henderson Farabow Garrett & Dunner

(57) ABSTRACT

A lower electrode 106 on which a wafer W can be placed and an upper electrode 108 are provided facing each other inside a processing chamber 102 of an etching apparatus 100. A first high frequency power supply 116 capable of outputting high frequency power for plasma generation is connected to the upper electrode 108 via a first matching device 114. A second high frequency power supply 122 capable of outputting high frequency power for biasing having a frequency lower than the frequency of the high frequency power for plasma generation is connected to the lower electrode 106 via a second matching device 120. Power that enables, at least, matching of the high frequency power for biasing is applied to the lower electrode 106 concurrently with the application of the high frequency power for plasma generation at a stable power level to the upper electrode 108. When the matching period has elapsed, the high frequency power for biasing applied to the lower electrode 106 is raised to the stable power level. This structure prevents any reduction in the plasma density and any excess voltage occurring at the electrodes when the high frequency power for biasing is applied.

16 Claims, 5 Drawing Sheets

METHOD FOR CONTROLLING PLASMA PROCESSOR

FIELD OF THE INVENTION

The present invention relates to a method for controlling a plasma processing apparatus and more specifically, it relates to a method for controlling the application of high frequency power in a parallel plates plasma processing apparatus.

DESCRIPTION OF THE RELATED ART

So-called parallel plates plasma processing apparatuses achieved by providing an upper electrode (a first electrode) and a lower electrode (a second electrode) with a target object (substrate) mounted thereupon facing each other within a processing chamber constituted of an air-tight processing container have been proposed in the prior art. In a typical parallel plates plasma processing apparatus, a glow discharge is caused between the two electrodes by applying high frequency power for plasma generation to the upper electrode to generate plasma from the processing gas supplied to the processing chamber. By applying high frequency power for biasing to the lower electrode, ions in the plasma are drawn to the target object placed on the lower electrode to perform a specific type of plasma processing such as etching.

During the actual processing, first, a high frequency power of steady-state power, for instance, 27 MHz, for plasma generation is applied to the upper electrode at a time point t1, as indicated in FIG. 5(a), to generate plasma inside the processing chamber. Next, as FIG. 5(a) illustrates, after a specific length of time has elapsed and the plasma density inside the processing chamber has stabilized, i.e., at a time point t2, a high frequency power of steady-state power, for instance, 800 kHz, for biasing which is lower than the frequency of the high frequency power for plasma generation, is applied to the lower electrode so that the ions in the plasma are controlled to be drawn into the target object placed on the lower electrode.

Now, if high frequency power is applied between the two electrodes in the parallel plates plasma processing apparatus structured as described above, the impedance between the two electrodes is high until plasma is generated and an electrical current starts to flow between the electrodes, which results in a high voltage momentarily generated between the two electrodes.

However, since the frequency of the high frequency power for plasma generation is high, the impedance of the capacitor constituted by the two electrodes is not considered to be excessively high. As a result, the high voltage occurring between the two electrodes due to the application of the high frequency power for plasma generation is not high enough to present a significant problem.

In the case of the high frequency power for biasing whose frequency is relatively low, applied after plasma is generated inside the processing chamber and the impedance between the two electrodes becomes reduced, it is assumed in the prior art that it generates no high voltage such as that described above.

However, through observation made by the inventors of the present invention it has become clear that during actual processing, even when the high frequency power at a relatively low frequency for biasing is applied, a high voltage is generated between the two electrodes to result in, for instance, an abnormal discharge occurring at insulated portions inside the processing chamber.

Now, an explanation is given on the mechanism of such an abnormal discharge in reference to FIG. 5(b). First, when the high frequency power for plasma generation is applied to the upper electrode at the time point t1, the voltage rises abruptly at the moment of application. However, since the frequency of the high frequency power for plasma generation is high, the process and the apparatus are not adversely affected to the extent to which an abnormal discharge results.

Next, at the time point t2, at which it is assumed that the plasma inside the processing chamber has stabilized, the high frequency power for biasing is applied to the lower electrode. The application of the high frequency power for biasing destabilizes the plasma generation system that has been thus far stable. This temporarily reduces the plasma density to result in an increase in the impedance between the two electrodes. As a result, as indicated in FIG. 5(b), a high voltage is temporarily generated. When this happens, the peak of the voltage of high frequency power for plasma generation applied to the upper electrode is not high enough to affect the process or the apparatus as mentioned earlier. In contrast, the high voltage caused by the high frequency power for biasing applied to the lower electrode causes an abrupt increase in the voltage near the lower electrode which may cause an abnormal discharge inside the processing chamber to adversely affect the process and the apparatus to a considerable degree.

In addition, the high voltage occurring when the high frequency power for biasing is applied to the lower electrode causes a misalignment of the matching point of a matching device connected to the upper electrode. Also, because the matching device engages in a servo operation to correct such misalignment of the matching point, a delay occurs until the plasma inside the processing chamber becomes stabilized again.

Accordingly, a first object of the present invention, which has been completed by addressing the problems of the method for controlling a plasma processing apparatus in the prior art discussed above, is to provide a new and improved method for controlling a plasma processing apparatus that makes it possible to minimize the extent of the adverse effect on the process and the apparatus caused by the high voltage occurring when high frequency power for biasing is applied.

In addition, another object of the present invention is to provide a new and improved method for controlling a plasma processing apparatus that makes it possible to prevent an abnormal discharge which would occur when high frequency power for biasing is applied and to minimize the misalignment of the matching point for the upper electrode which would occur at the same time.

SUMMARY OF THE INVENTION

In order to achieve the objects described above, the present invention provides a method for controlling a plasma processing apparatus having a first electrode and a second electrode facing each other within the processing chamber and generates plasma inside the processing chamber by applying high frequency power for plasma generation having a first frequency to the first electrode via a first matching device and by applying high frequency power for biasing having a second frequency lower than the first frequency to the second electrode via a second matching device to perform a specific type of plasma processing on a target object placed on the second electrode.

In a first aspect of the present invention, the method for controlling the plasma processing apparatus described above comprises a step in which a high frequency power of steady-state power is applied to the first electrode and a high frequency power at a level at which, at least, the high frequency power for biasing can be matched, is applied to the second electrode and a step in which after the high frequency power for biasing has been substantially matched, the high frequency power applied to the second electrode is raised to the steady-state power level.

In this structure, first, plasma is generated inside the processing chamber by applying the high frequency power for plasma generation to the first electrode. In addition, high frequency power for biasing is applied to the second electrode. However, since the high frequency power applied to the second electrode is at a low level that allows the high frequency power for biasing to be substantially matched, its overshoot voltage is not high enough to cause an abnormal discharge even though it is in a low frequency range.

According to the knowledge of the inventors of the present invention, the matching point does not become greatly misaligned even if the power that is being applied changes once the plasma generation system has achieved a matched state, and the plasma generation system does not become overly destabilized even if the level of the high frequency power applied to the second electrode is raised to a steady-state after the plasma inside the processing chamber has been stabilized. Consequently, almost no high voltage resulting from an overshoot occurs as it would in the prior art.

In the first aspect of the present invention, an appropriate sensor, e.g., an optical sensor, is employed to verify that the high frequency power for biasing has been substantially matched and that the plasma has become stabilized before raising the high frequency power applied to the second electrode to the steady-state power level. In a second aspect of the present invention, data of a specific length of time is set into a recipe in advance and the high frequency power applied to the second electrode is raised to the steady-state level after the specific length of time has elapsed. Since this method allows the actual processing to be performed in conformance to a recipe determined in correspondence to optimal processing conditions using a dummy wafer or the like, simplification of processing is achieved. In addition, since devices such as the sensor for determining whether or not the high frequency power for biasing has been substantially matched can be omitted, the initial cost of the apparatus can be reduced.

Furthermore, while only the high frequency power for biasing applied to the second electrode is controlled in the first aspect and the second aspect of the present invention, control may be implemented for the high frequency power for plasma generation applied to the first electrode, as well. Namely, in a third aspect of the present invention, the method for controlling a plasma processing apparatus comprises a step in which high frequency power that enables, at least, plasma generation inside the processing chamber is applied to the first electrode and high frequency power at a level that enables, at least, the high frequency power for biasing to become matched is applied to the second electrode and a step in which after at least the high frequency power for biasing becomes substantially matched, the high frequency power applied to the first electrode and the high frequency power applied to the second electrode are raised to a steady-state level.

While the high frequency power applied to the first electrode is in a high frequency range that does not normally induce a high voltage resulting from a rapid overshoot, it may occasionally adversely affect the process or the apparatus with the high voltage occurring at the time of its application. Thus, by ensuring that the power applied to the first electrode is controlled at a level that is just sufficient to generate plasma inside the processing chamber as in the third aspect of the present invention, the extent to which the process and the apparatus are affected when the high frequency power is applied to the first electrode can be minimized in addition to achieving the advantages of the first aspect explained earlier.

In the third aspect of the present invention, too, the timing with which the high frequency power is raised to a steady-state level can be adjusted as in the second aspect of the present invention. Namely, in a fourth aspect of the present invention, the high frequency power applied to the first electrode and the high frequency power applied to the second electrode are raised to a steady steady-state level after the specific length of time has elapsed. This method achieves simplification both in the processing and the apparatus as in the second aspect of the present invention.

It is to be noted that in the first ~fourth aspects of present invention, the power that allows matching applied to the second electrode during the initial stage of plasma generation should be at a level that does not allow etching to proceed, and in more specific terms, it is desirable to set the level of the power at roughly 3~10% of the steady-state power. In addition, in the third and fourth aspects of the present invention, it is desirable to set the level of the power applied to the first electrode for plasma generation during the initial stage of plasma generation at 50~70% of the steady-state power.

Moreover, in the third and fourth aspects of the present invention, it is desirable that when raising the high frequency power applied to the first electrode and the high frequency power applied to the second electrode to the steady-state power level, the power applied to the first electrode be set to the steady-state power level and then the power applied to the second electrode be set to the steady-state power level. By raising the power applied to the first electrode to the steady-state power level first, it is ensured that the impedance is reduced by increasing the plasma density between the two electrodes. Thus, when the power applied to the second electrode is subsequently raised to the steady-state power level, the resulting overshoot can be reduced.

DETAILED DESCRIPTION OF THE PREFERRED EMBODIMENTS

The following is a detailed explanation of the embodiments employing the method for controlling a plasma processing apparatus according to the present invention implemented as a method for controlling an etching apparatus, given in reference to the attached drawings.

Figure 1:
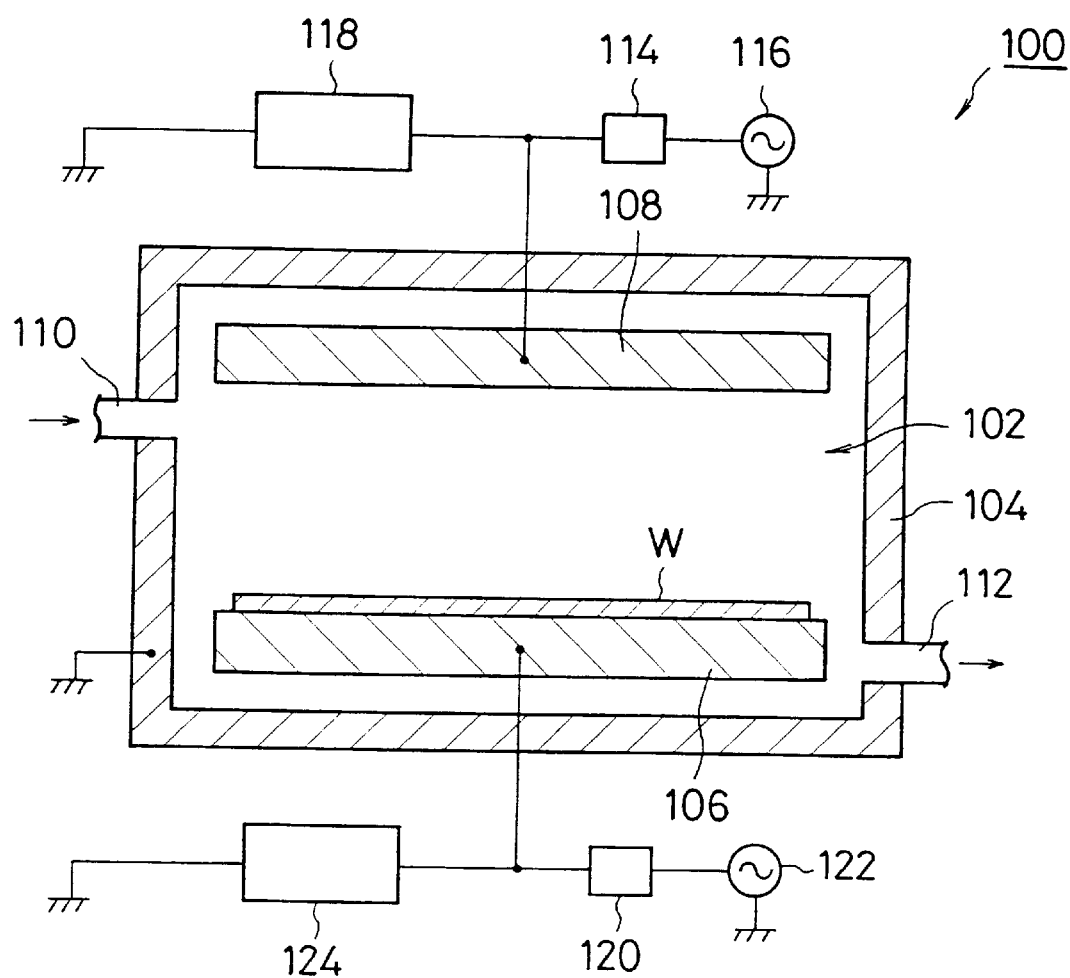
FIG. 1 is a schematic cross section illustrating an etching apparatus that may employ the present invention.

First, in reference to FIG. 1, the structure of an etching apparatus 100 that may employ the present invention is explained. A processing chamber 102 of the etching apparatus 100 is formed inside a grounded airtight processing container 104 of conductive material. In addition, inside the processing chamber 102, a lower electrode (second electrode) 106 of conductive material, which is the susceptor, and an upper electrode (first electrode) 108 of conductive material are provided facing each other. A mounting surface on which an 8-inch semiconductor wafer (hereafter referred to as a wafer) W, for instance, may be placed, is formed on the lower electrode 106.

A gas transfer pipe 110 is connected at the upper portion of the processing chamber 102 to enable the supply of a specific type of processing gas into the processing chamber 102 from a gas supply source (not shown). Furthermore, an outlet pipe 112 is connected at the lower portion of the processing chamber 102 so that the atmosphere in the processing chamber 102 is maintained at a specific reduced pressure of, for instance, 10~100 mTorr by a vacuum pump mechanism (not shown).

Next, a high frequency power supply system in the etching apparatus 100 is explained. A first high frequency power supply 116 is connected to the upper electrode 108 via a first matching device 114. In addition, a low pass filter 118 is connected between the upper electrode 108 and the first matching device 114 to allow a portion of the high frequency power applied to the lower electrode 106 to flow to the ground. Furthermore, a second high frequency power supply 122 is connected to the lower electrode 106 via a second matching device 120. A high pass filter 124 is connected between the lower electrode 106 and the second matching device 120 to allow a portion of the high frequency power applied to the upper electrode 108 to flow to the ground.

During the plasma processing, high frequency power for plasma generation is applied from the first high frequency power supply 116 to the upper electrode 108 via the first matching device 114. This high frequency power for plasma generation is at a level high enough to generate plasma by dissociating the processing gas inside the processing chamber 102, e.g., at 2000 W, and the frequency of the high frequency power is, for instance, 27 MHz. In addition, high frequency power for biasing is applied to the lower electrode 106 from the second high frequency power supply 122 via the second matching device 124. The power of the high frequency power for biasing may be, for instance, 1400 W. The frequency of the high frequency power for biasing is set relatively low at, for instance, 800 kHz. At these power level and frequency settings, plasma cannot be generated in the processing chamber 102 at a vacuum pressure of, for instance, under 200 mTorr. However, the wafer W can be held at the biasing potential to draw the ions in the plasma to the processing surface (or the "surface") of the wafer. As a result, the SiO2 film at the surface of the wafer W is etched.

(First embodiment)

Next, the first embodiment of the method for controlling the etching apparatus structured as described above is explained in reference to FIG. 2.

Figure 2A:
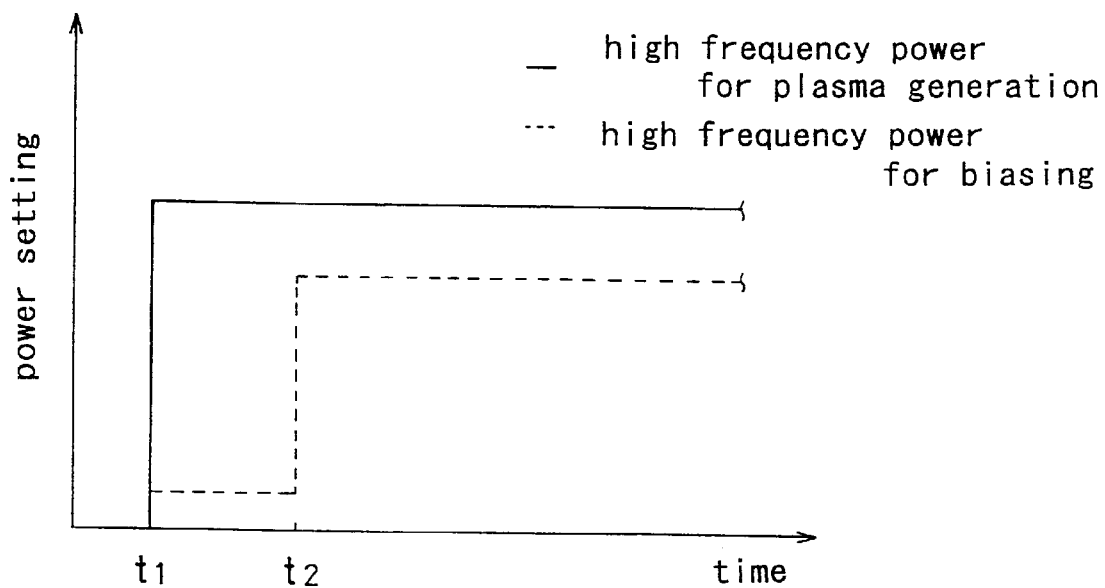
FIG. 2 schematically illustrates a method for controlling the etching apparatus illustrated in FIG. 1.
Figure 2B:
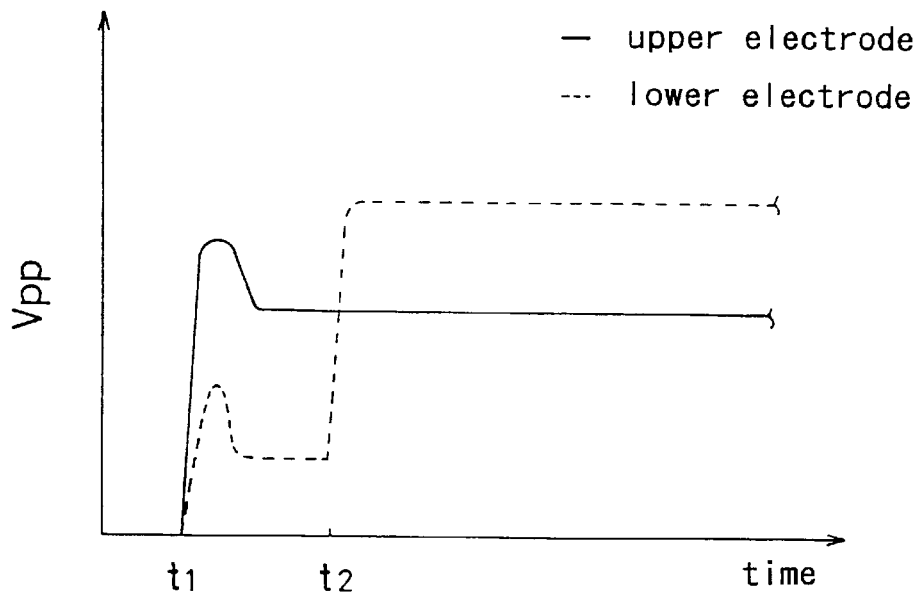

First, after placing the wafer W on the lower electrode 106, the processing gas is supplied to the processing chamber 102 while the atmosphere inside the processing chamber 102 is held at a specific reduced pressure. Next, as illustrated in FIG. 2(a), at the time point t1, plasma is generated inside the processing chamber 102 by applying high frequency power of steady-state power, for instance, 2000 W output by the first high frequency power supply 116 to the upper electrode 108. The voltage near the upper electrode 108 surges as illustrated in FIG. 2(b) during this process to cause an overshoot. However, no abnormal discharge that may adversely affect the process or the apparatus occurs inside the processing chamber since the frequency of the power for plasma generation is high.

In addition, as illustrated in FIG. 2, the high frequency power for biasing output by the second high frequency power supply 122 is applied to the lower electrode 106 almost concurrently with the application of the high frequency power for plasma generation to the upper electrode 108 in this embodiment. Since the frequency of the high frequency power for biasing is relatively low, the extent of the overshoot occurring at the lower electrode 106 cannot be disregarded. However, in this embodiment, the high frequency power for biasing applied at the time point t1 is high frequency power that is, for instance, 3~10% of the steady-state power. For example, the high frequency power is at a level of 42~140 W with the steady-state power at 1400 W.

As explained above, since only the high frequency power at a low level is applied to the lower electrode 106 at the time point t1 in this embodiment, the increase in the voltage can be kept relatively small even in the low frequency range, as illustrated in FIG. 2(b). Consequently, no abnormal discharge occurs resulting from the voltage overshoot so that the adverse effect on the process or the apparatus can be minimized.

In addition, since the etching time is normally managed within a time frame running from the time point t2 in FIG. 2 to the etching end time point (not shown), it is desirable to set the high frequency power for biasing applied at the time point t1 at a level at which etching does not proceed, e.g., at less than 10% of the steady-state power if an SiO2 film is to be etched. It is to be noted that the power applied to the lower electrode 106 at the time point t1 needs to be at a level that allows the output of the second high frequency power supply 122 to stabilize and normal matching of the high frequency power for biasing to be achieved by the second matching device 120. This means that it should be at 3% of the steady-state power or higher.

As a result, as illustrated in FIG. 2(b), even when the high frequency power for biasing is raised to the steady-state power level at the time point t2, no overshoot occurs in the high frequency power for biasing so that misalignment of the matching point can be minimized. Furthermore, since the high frequency power for plasma generation is not affected to the extent at which the matching point of the first matching device 114 becomes misaligned when the high frequency power for biasing is raised to the steady-state power level at the time point t2, the plasma can be maintained stable inside the processing chamber 102. Thus, the length of time required for the readjustment of the matching point of the high frequency power for plasma generation can be reduced compared to the prior art when applying the high frequency power for biasing.

It is to be noted that at the time point t2, the high frequency power for biasing is raised to the steady-state power level after verifying that the plasma density has stabilized by observing the state of the plasma with a sensor (not shown), e.g., an optical sensor capable of measuring the plasma spectrum. As an alternative, the time point t2 may be determined in advance by using a dummy wafer or the like. The time point t2 that has been determined is registered in a recipe. The actual processing is executed in conformance to the recipe.

(Second embodiment)

Next, the second embodiment of the method for controlling the etching apparatus 100 structured as described above is explained in reference to FIG. 3.

Unlike in the first embodiment, in the second embodiment the high frequency power for plasma generation applied to the upper electrode 108, as well as the high frequency power for biasing applied to the lower electrode 106, is kept at a level lower than the steady-state power at the time point t1 at which power is turned on.

Generally, it is believed that, the overshoot of the voltage occurring at power on does not cause an abnormal discharge inside the processing chamber 102 since the frequency of the high frequency power for plasma generation applied to the upper electrode 108 is relatively high. However, since its effect is not completely nonexistent, the overshoot of the voltage at power on can be suppressed even more effectively, as illustrated in FIG. 3(b) by keeping the level of the high frequency power for plasma generation applied to the upper electrode 108 down to, for instance, 50~70% of the steady-state power, as in this embodiment. In other words, the level should be maintained within a range of 1000~1400 W relative to a steady-state power of 2000 W.

In addition, as in the first embodiment, high frequency power, which is sufficiently low, e.g., 3~10% of the steady-state power, is applied to the lower electrode 106 in this embodiment so that the increase in the voltage can be largely suppressed even in the low frequency range, as illustrated in FIG. 3(b).

However, it is necessary to maintain the high frequency power for plasma generation applied to the upper electrode 108 at a level that allows plasma generation inside the processing chamber 102 even at power on. In addition, the increasing rate of the plasma density is high relative to that of the power when the power level is low. However, the rate becomes reduced as the power exceeds a specific value. Considering the stability of the plasma when the power is set to the steady-state power level at the time point t2, it is desirable to set the value of the power at the time point t1 within the range over which the increasing rate of the plasma density is low. Consequently, the power level needs to be maintained at, for instance, 50~70% of the steady-state power.

In addition, matching is achieved for the high frequency power applied to the upper electrode 108 and the high frequency power applied to the lower electrode 106 between the time point t1 and the time point t2. Thus, even when the high frequency power applied to the upper electrode 108 and the high frequency power applied to the lower electrode 106 are raised to the steady-state power level, the matching point does not become misaligned to a significant degree. Consequently, the voltage components and the current components of the high frequency power are not disrupted. This results in a state in which the plasma is maintained stable inside the processing chamber 102.

Figure 3A:
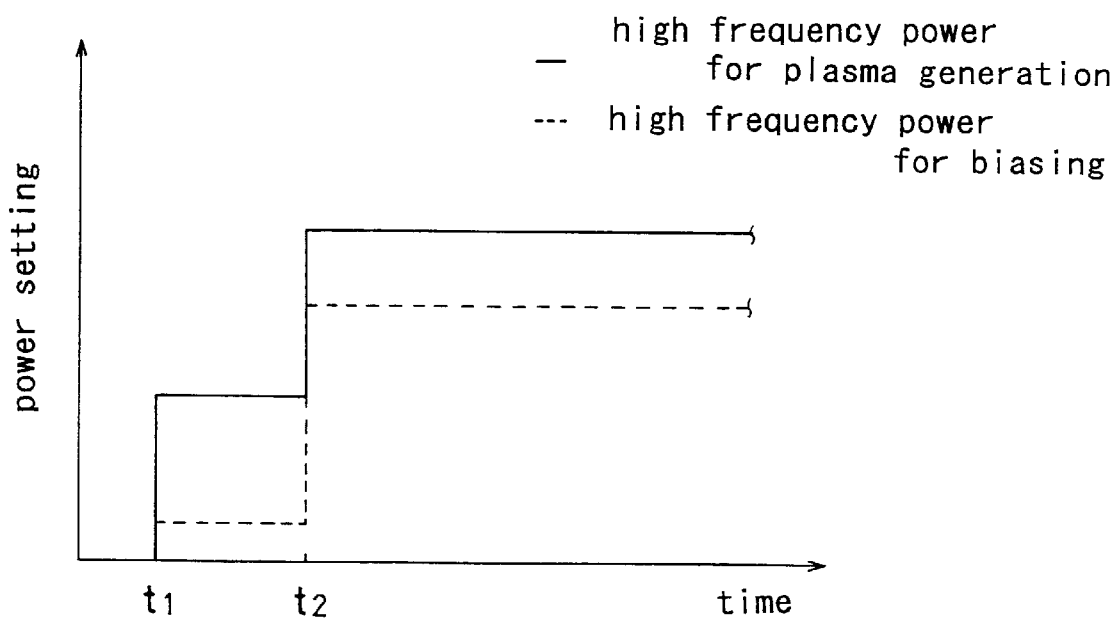
FIG. 3 schematically illustrates another method for controlling the etching apparatus illustrated in FIG. 1.
Figure 3B:
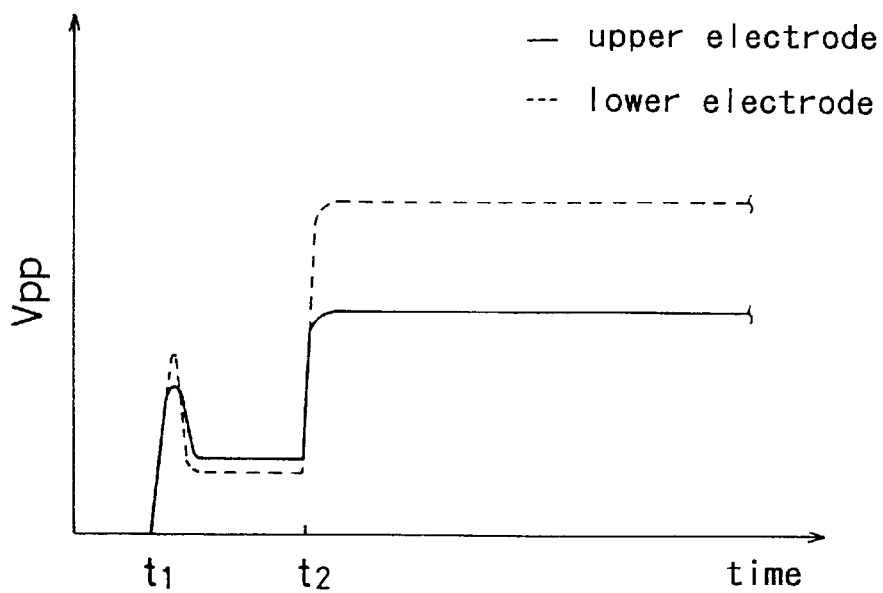
Figure 4A:
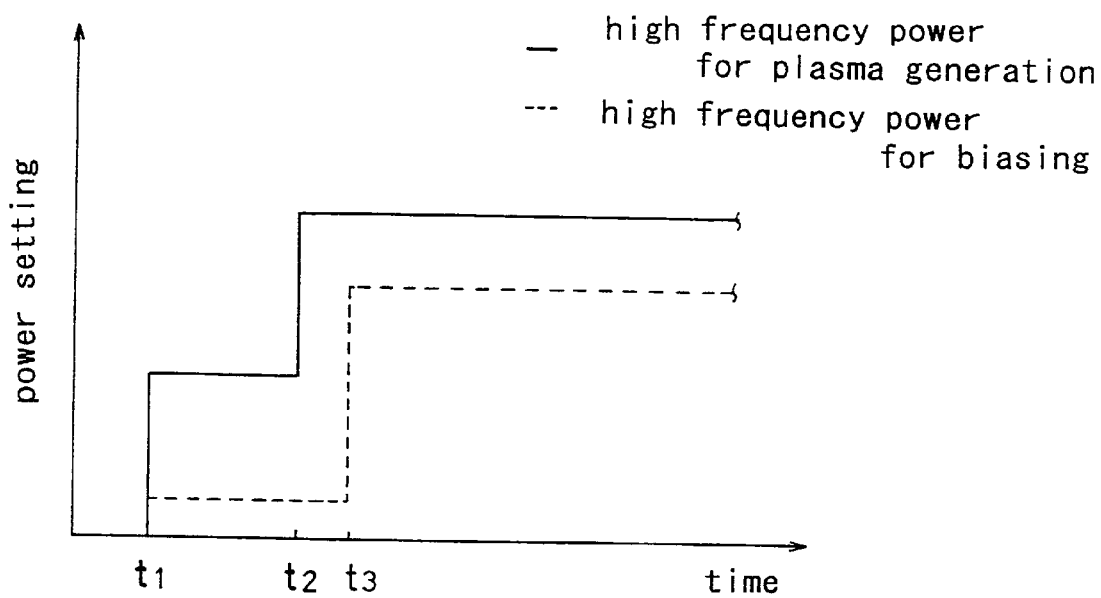
FIG. 4 schematically illustrates yet another method for controlling the etching apparatus illustrated in FIG. 1.
Figure 4B:
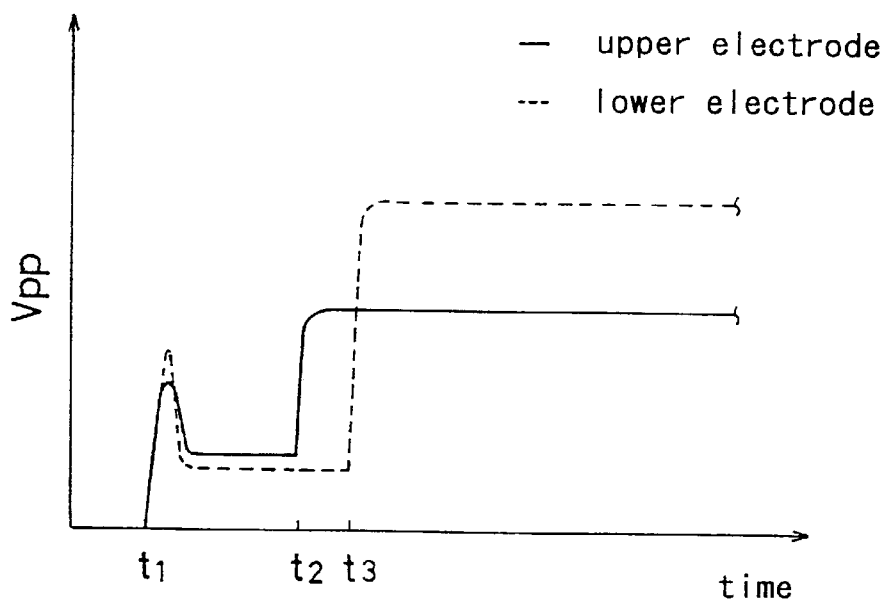
Figure 5A:
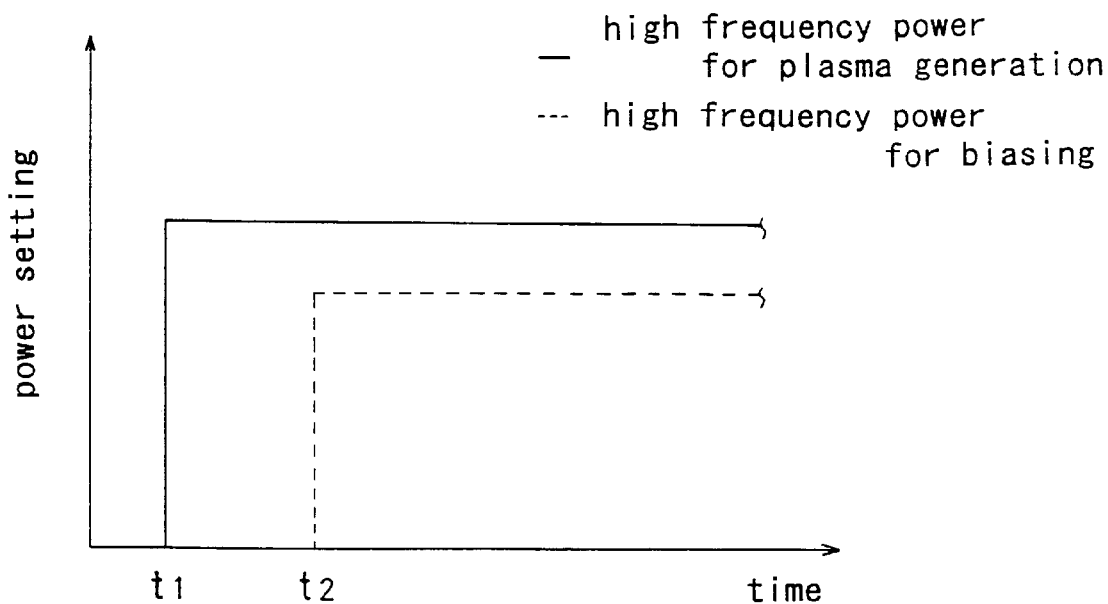
FIG. 5 schematically illustrates a method for controlling an etching apparatus in the prior art.
Figure 5B:
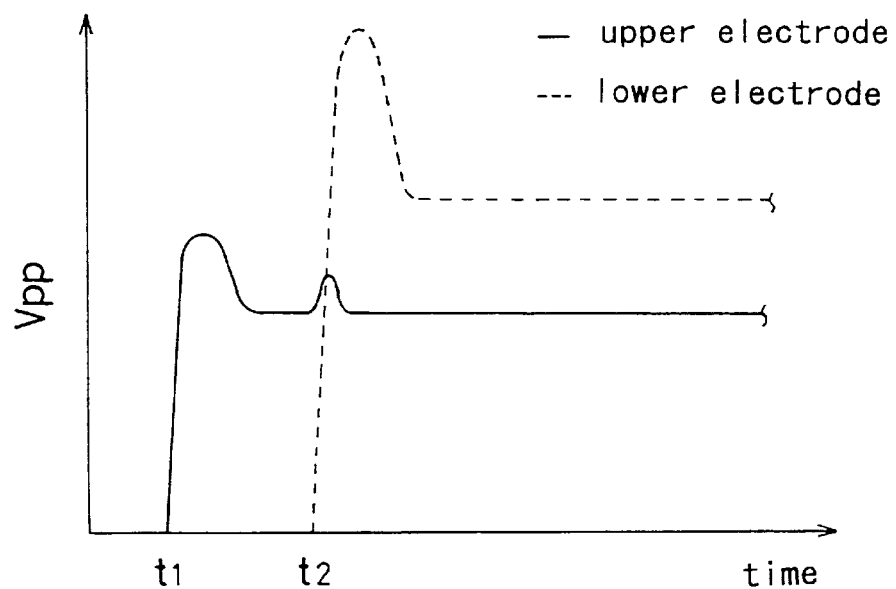

The high frequency power for plasma generation and the high frequency power for biasing are both set to the steady-state power level at the same time at the time point t2 in the embodiment illustrated in FIG. 3. Its to be noted that the timing with which the high frequency power for biasing is raised to the steady-state power level may be set at a time point t3 with a delay relative to the time point t2, as illustrated in FIG. 4. In this structure, since the high frequency power for biasing is raised to the steady-state power level after the high frequency power for plasma generation is first raised to the steady-state power level, i.e., after increasing the plasma density to a sufficient degree and reducing the impedance between the two electrodes, overshoot can be prevented even more effectively.

While the invention has been particularly shown and described with respect to preferred embodiments thereof by referring to the attached drawings, the present invention is not limited to these structural examples and it will be understood by those skilled in the art that various changes in form and detail may be made therein without departing from the spirit, scope and teaching of the invention.

For instance, while examples in which high frequency power is applied to the upper electrode and the lower electrode at the same time at the time point t1 are explained above in reference to the embodiments, high frequency power may be applied only to the upper electrode at the time point t1, and high frequency power at a level that allows matching may be applied to the lower electrode at a time point between the time points t1 and t2, instead.

In addition, while the explanation is given above in reference to the embodiments by using a structural example in which the processing gas is supplied into the processing chamber through the gas transfer pipe provided at a side wall of the processing chamber, the present invention is not restricted to this structural example. As an alternative, it may be employed in an apparatus having a shower head provided at a surface of the upper electrode facing toward the lower electrode, the processing gas may be supplied into the processing chamber through the shower head.

Furthermore, while the present invention is explained by using an etching apparatus as an example in reference to the embodiments above, the present invention is not restricted to this example and it may be employed in any plasma processing apparatus that is structured to perform processing on a target object using plasma generated by applying high frequency power for plasma generation and high frequency power for biasing to the electrodes provided facing each other inside the processing chamber.

Moreover, while an example is used in the explanation of the embodiment in which processing is performed on a wafer, the present invention is not restricted to this example, and it may be employed in an apparatus that performs plasma processing on, for instance, an LCD glass substrate.

Industrial Applicability

The present invention may be employed in a plasma processing apparatus that performs plasma processing such as etching on a target object such as a wafer. In particular, the present invention is an ideal method for controlling a plasma processing apparatus having a first electrode and a second electrode provided facing each other inside a processing chamber, which performs a specific type of plasma processing on a target object placed on the second electrode by applying high frequency power for plasma generation having a first frequency to the first electrode via a first matching device and applying high frequency power for biasing having a second frequency lower than the first frequency to the second electrode via a second matching device.

According to the present invention, the effect of a voltage overshoot occurring at the second electrode can be minimized by controlling the power level at power on when the high frequency power for biasing having a relatively low frequency is applied to the second electrode. Consequently, any adverse effect on the process or the apparatus such as an abnormal discharge can be largely suppressed. Furthermore, even when the high frequency power for biasing is raised to the steady-state power level, the plasma generated inside the processing chamber maintains a steady-state level so that a prompt plasma processing state can be achieved promptly.

What is claimed is:

1. A method for controlling a plasma processing apparatus having a first electrode and a second electrode provided facing each other inside a processing chamber thereof that generates plasma inside said processing chamber by applying high frequency power for plasma generation having a first frequency to said first electrode via a first matching device and applying high frequency power for biasing having a second frequency lower than said first frequency to said second electrode via a second matching device to perform a specific type of plasma processing on a target object placed on said second electrode, comprising:

a step in which high frequency power of steady-state power is applied to said first electrode and high frequency power at a level that enables, at least, matching of said high frequency power for biasing is applied to said second electrode; and a step in which said high frequency power applied to said second electrode is raised to a steady-state level after said high frequency power for biasing has been substantially matched.

2. A method for controlling a plasma processing apparatus according to claim 1, wherein:

said high frequency power that allows matching is at a level at which etching on said target object does not proceed.

3. A method for controlling a plasma processing apparatus according to claim 1, wherein:

said high frequency power that allows matching is at a level that is approximately 3~10% of steady-state power.

4. A method for controlling a plasma processing apparatus having a first electrode and a second electrode provided facing each other inside a processing chamber thereof that generates plasma inside said processing chamber by applying high frequency power for plasma generation having a first frequency to said first electrode via a first matching device and applying high frequency power for biasing having a second frequency lower than said first frequency to said second electrode via a second matching device to perform a specific type of plasma processing on a target object placed on said second electrode, comprising:

a step in which high frequency power of steady-state power is applied to said first electrode and high frequency power at a level that enables, at least, matching of said high frequency power for biasing is applied to said second electrode; and a step in which said high frequency power applied to said second electrode is raised to a stable power level after a specific length of time has elapsed.

5. A method for controlling a plasma processing apparatus according to claim 4, wherein:

said high frequency power that allows matching is at a level at which etching on said target object does not proceed.

6. A method for controlling a plasma processing apparatus according to claim 4, wherein:

said high frequency power that allows matching is at a level that is approximately 3~10% of steady-state power.

7. A method for controlling a plasma processing apparatus having a first electrode and a second electrode provided facing each other inside a processing chamber thereof that generates plasma inside said processing chamber by applying high frequency power for plasma generation having a first frequency to said first electrode via a first matching device and applying high frequency power for biasing having a second frequency lower than said first frequency to said second electrode via a second matching device to perform a specific type of plasma processing on a target object placed on said second electrode, comprising:

a step in which high frequency power that enables, at least, generation of plasma inside said processing chamber is applied to said first electrode and high frequency power at a level that enables, at least, matching of said high frequency power for biasing is applied to said second electrode; and a step in which after at least said high frequency power for biasing is at least substantially matched, said high frequency power applied to said first electrode and said high frequency power applied to said second electrode are raised to a steady-state power level.

8. A method for controlling a plasma processing apparatus according to claim 7, wherein:

said high frequency power that allows matching is at a level at which etching does not proceed.

9. A method for controlling a plasma processing apparatus according to claim 7, wherein:

said high frequency power that allows matching is at a level that is approximately 3~10% of steady-state power.

10. A method for controlling a plasma processing apparatus according to claim 7, wherein:

said high frequency power that allows generation of plasma is at a level that is 50~70% of steady-state power.

11. A method for controlling a plasma processing apparatus according to claim 7, wherein:

in said step in which said high frequency power applied to said first electrode and said high frequency power applied to said second electrode are raised to steady-state power level, said high frequency power applied to said second electrode is set to steady-state power level after setting said high frequency power applied to said first electrode to steady-state power level.

12. A method for controlling a plasma processing apparatus having a first electrode and a second electrode provided facing each other inside a processing chamber thereof that generates plasma inside said processing chamber by applying high frequency power for plasma generation having a first frequency to said first electrode via a first matching device and applying high frequency power for biasing having a second frequency lower than said first frequency to said second electrode via a second matching device to perform a specific type of plasma processing on a target object placed on said second electrode, comprising:

a step in which high frequency power that enables at least generation of plasma inside said processing chamber is applied to said first electrode and high frequency power at a level that enables, at least, matching of said high frequency power for biasing is applied to said second electrode; and a step in which after a specific length of time has elapsed, said high frequency power applied to said first electrode and said high frequency power applied to said second electrode are raised to steady-state power level.

13. A method for controlling a plasma processing apparatus according to claim 12, wherein:

said high frequency power that allows matching is at a level at which etching does not proceed.

14. A method for controlling a plasma processing apparatus according to claim 12, wherein:
   said high frequency power that allows matching is at a level that is approximately 3~10% of steady-state power.

15. A method for controlling a plasma processing apparatus according to claim 12, wherein:
   said high frequency power that allows generation of plasma is at a level that is 50~70% of steady-state power.

16. A method for controlling a plasma processing apparatus according to claim 12, wherein:
   in said step in which said high frequency power applied to said first electrode and said high frequency power applied to said second electrode are raised to steady-state power level, said high frequency power applied to said second electrode is set to steady-state power level after setting said high frequency power applied to said first electrode to steady-state power level.

* * * * *